United States Patent [19]

Ueda et al.

[11] Patent Number: 4,875,073
[45] Date of Patent: Oct. 17, 1989

[54] COLOR PICTURE IMAGE RECORDING APPARATUS CAPABLE OF ADJUSTING COLOR TONE IN THE COPY SHEET

[75] Inventors: Masashi Ueda; Yoichi Horaguchi, both of Nagoya; Kenji Sakakibara, Ichinomiya, all of Japan

[73] Assignee: Brother Kogyo Kabushiki Kaisha, Aichi, Japan

[21] Appl. No.: 167,140

[22] Filed: Mar. 11, 1988

[30] Foreign Application Priority Data

Mar. 12, 1987 [JP] Japan .................................. 62-57188
Jan. 29, 1988 [JP] Japan .................................. 63-20986

[51] Int. Cl.$^4$ ........................ G03B 27/32; G03B 27/52
[52] U.S. Cl. ......................................... 355/27; 355/35
[58] Field of Search ................... 355/27, 35, 38, 32; 430/138

[56] References Cited

U.S. PATENT DOCUMENTS 3,982,825  9/1976  Mitchell ................................ 355/35
4,319,834  3/1982  Terrill ................................... 355/35
4,751,165  6/1988  Rourke et al. ........................ 430/138

Primary Examiner—Monroe H. Hayes
Attorney, Agent, or Firm—Oliff & Berridge

[57] ABSTRACT

In a color picture image recording apparatus using a photosensitive and pressure-sensitive recording sheet having on its surface pressure rupturable microcapsules each containing a photosensitive material and a chromogenic material selected from cyan, magenta and yellow, and a mechanical strength of the microcapsule varies when exposed, a color tone of a reproduced picture image can easily be adjusted by the provision of a filter unit. The filter unit is used in conjunction with a radiation unit which radiates onto the photosensitive and pressure-sensitive recording sheet a light carrying a color image of an original to form a latent image, and includes filters each selectively passing a light of a particular wavelength which causes to vary the mechanical strength of one of the cyan-, magneta-and yellow-containing microcapsules. Each of the filters is movably disposed on a light path so as to change its filtering characteristic, whereby when the photosensitive and pressure-sensitive recording sheet is pressure-developed, the color tone of the reproduced color image can be adjusted.

11 Claims, 5 Drawing Sheets

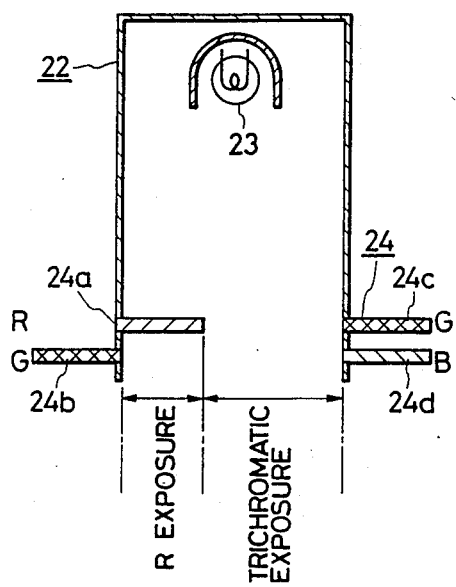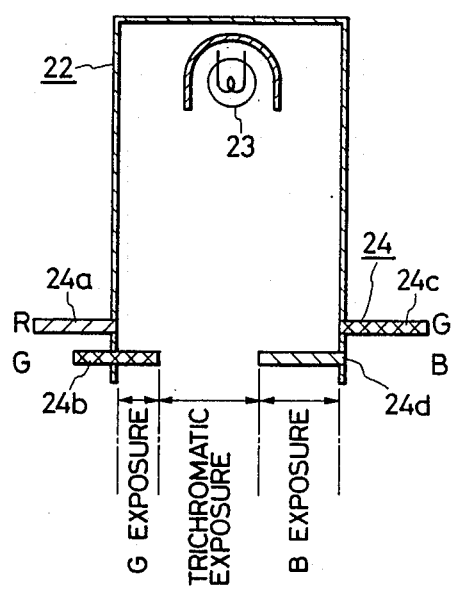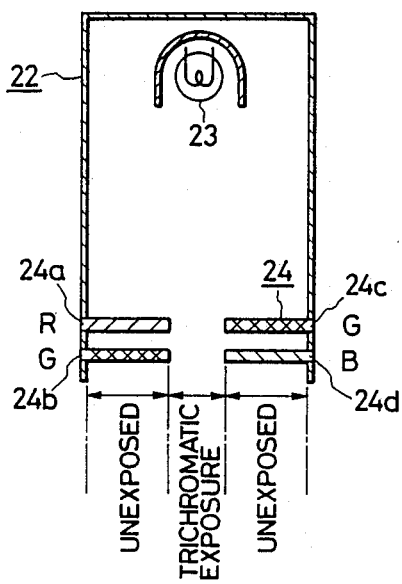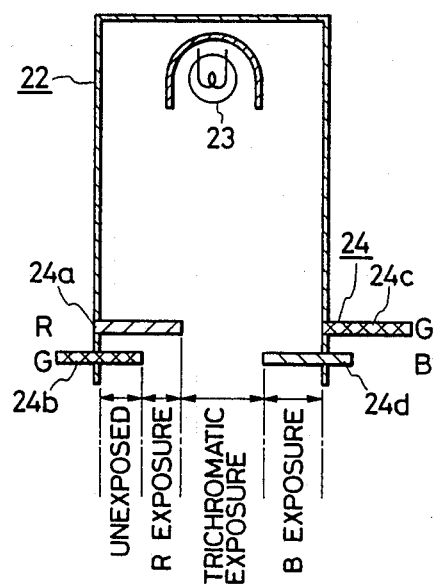

COLOR PICTURE IMAGE RECORDING APPARATUS CAPABLE OF ADJUSTING COLOR TONE IN THE COPY SHEET

BACKGROUND OF THE INVENTION

The present invention relates to a color picture image recording apparatus for recording a color picture image of an original on a recording medium. More particularly, the invention relates to a color picture image recording apparatus in which a color balance of a copy sheet can easily be adjusted.

A prior art recording apparatus of the type to which the present invention relates is disclosed in a co-pending U.S. patent application Ser. No. 50,313 filed on May 14, 1987 by Sangyouji et al. This prior art apparatus is constructed so that the image carrying surface of an original is scanned and a light shielding image corresponding to a color picture image of the original is copied on an intermediary film made of a light transmissive material, and then a photosensitive and pressure-sensitive recording sheet is exposed through the intermediary film to form a latent image. This apparatus is advantageous in that time needed for copying the light shielding image on the intermediary film is shortened in comparison with an apparatus in which three primary color picture images are independently and separately copied one after another on the intermediary film to overlap with one another and exposure is taken place each time one of the three primary color images is copied. The prior art apparatus disclosed in the above-mentioned U.S. patent application is further advantageous in that the exposure can be started before the entire light shielding image is copied on the intermediary film, hence a running time can be shortened. The prior art apparatus is also advantageous in that a highly precise positioning device is not required for exactly overlapping the three primary color images on the intermediary film.

However, in the photosensitive and pressure-sensitive recording sheet carrying pressure rupturable microcapsules each containing one of three primary colors of cyan, magenta and yellow, the radiation sensitivity of the microcapsules is not even but differs depending upon the colors. In addition, an exposure light source has variations in light radiation distribution. For the reasons stated above, the prior art color picture image recording apparatus is not satisfactory in that the color tone on the recording sheet is liable to be imbalanced and thus the apparatus is not suitable for a practical use.

Furthermore, preference of colors is different depending on the individual. It is therefore convenient if the color balance of the copy sheet can be adjusted depending on the preference of the user. Such an adjustment cannot be achieved in the above-described prior art apparatus.

In view of the foregoing, it has been proposed to adjust the color tone by a color correction filter. The filter is used to uniformly cover the surface of the original or the surface of the photosensitive recording sheet. With such a method, however, the color tone is not continuously adjustable and it is necessary to replace the color correction filter when a different color adjustment is desired.

SUMMARY OF THE INVENTION

The present invention has been made in view of the foregoing, and accordingly it is an object of the invention to provide a color picture image recording apparatus in which a color tone of the copy sheet can easily be adjusted while shortening running time and maintaining the simplicity of the arrangement of the apparatus.

In order to achieve the above and other objects, the invention provides a color image recording apparatus in which a filter unit is used in conjunction with a radiation unit which radiates a light carrying a color image of an original onto a photosensitive and pressure-sensitive recording sheet to form a latent image thereon corresponding to the color image of the original. The photosensitive and pressure-sensitive recording sheet has on its surface pressure rupturable microcapsules each containing a photosensitive material and a chromogenic material selected from cyan, magenta and yellow, and a mechanical strength of the microcapsule varies when exposed. The filter unit includes a red filter for passing only a light of a wavelength which causes to vary the mechanical strength of a cyan-containing microcapsule, a blue filter for passing only a light of a wavelength which causes to vary the mechanical strength of a yellow-containing microcapsule and a green filter for passing only a light of a wavelength which causes to vary the mechanical strength of a magenta-containing microcapsule. Each of the filters is movably disposed on a light path so as to change its filtering characteristics.

BRIEF DESCRIPTION OF THE DRAWINGS

In the drawings:

FIG. 3A through 3D are partial cross-sectional side views showing various filtering states;

DESCRIPTION OF THE PREFERRED EMBODIMENTS

Preferred embodiments according to the present invention will now be described with reference to the accompanying drawings.

Figure 1:
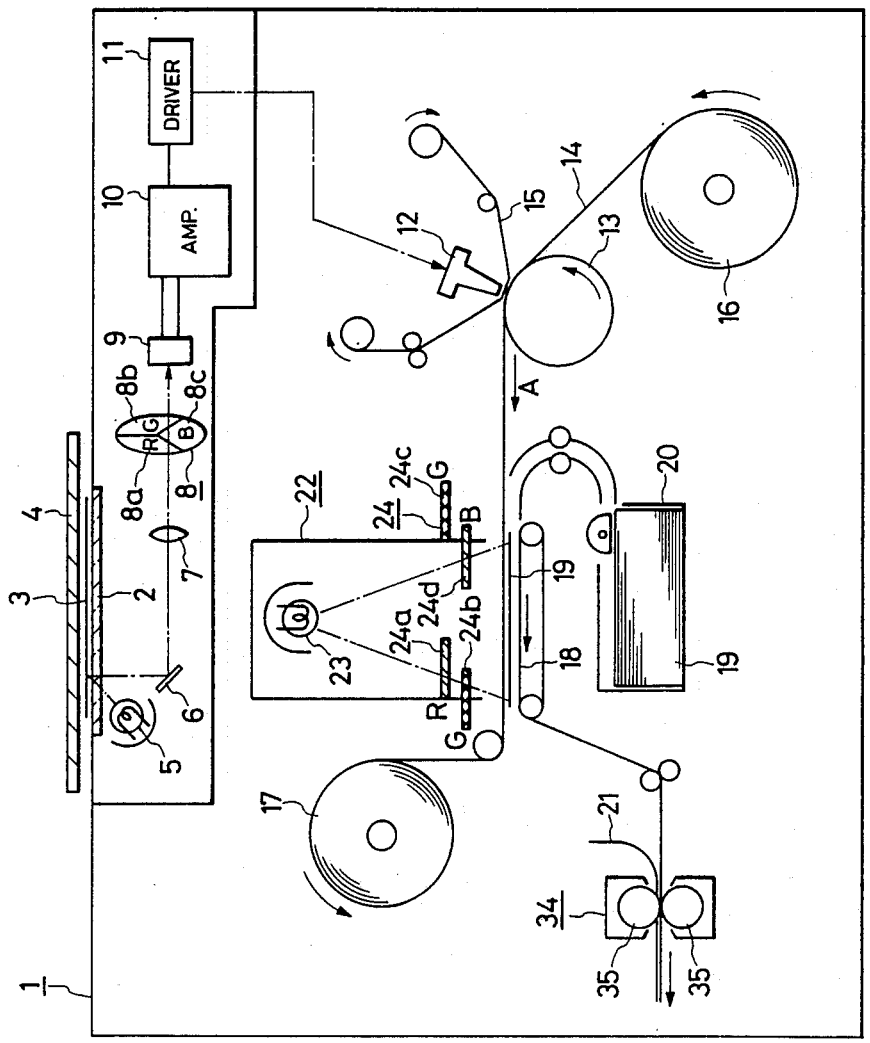
FIG. 1 is a cross-sectional side view showing a color picture image recording apparatus according to a first embodiment of the present invention.

Shown in FIG. 1 is a cross-sectional side view of the color picture image recording apparatus according to the first embodiment of the invention. In this apparatus, an original-support member 2 made of a transparent glass is provided in the upper portion of the apparatus 1, on which an original 3 is placed with the image carrying surface face-down. A cover member 4 is provided to cover the original 3. Below the original-support member 2, a lamp 5 is disposed which radiates light for scanning the original 3. A reflection mirror 6, a focusing lens 7, a trichromatic resolution filter 8, and a CCD (Charge-Coupled Device) 9 serving as a color image sensor constitute an optical system and are arranged in the stated order to pass the reflected light therethrough. The filter 8 includes a red filter 8a transmitting only red color, green filter 8b transmitting only green color and a blue filter 8c transmitting only blue color.

The output of the CCD 9 is connected through an amplifier 10 and a driver 11 to an impact head 12 which may be a wire-dot type print head. The impact head 12 is positioned to confront a platen 13. An intermediary sheet 14 and a color ink ribbon 15 are interposed between the impact head 12 and the platen 13. The intermediary sheet 14 is made of a light transmissive material, e.g. a resin film or a paper sheet. The intermediary sheet 14 wound around a supply roller 16 passes between the impact head 12 and the platen 13, is extended to the direction indicated by an arrow A, and is taken up by a take-up roller 17. The color ink ribbon 15 is made up of three sections of red, green and blue colors, which are selectively used to form a multi-color light transmissive image on the intermediary sheet 14.

A roll conveyor type exposure stand 18 is disposed alongside the feeding path of the intermediary sheet 14, on which a cut photosensitive and pressure-sensitive recording sheet 19 is movingly supported. The recording sheets 19 are stacked in a sheet cassette 20 and the uppermost sheet is fed out by a semi-circular shape roller. On one surface of the photosensitive and pressure-sensitive recording sheet 19, cyan, magenta and yellow microcapsules being uniformly mixed with one another are dispersedly coated. The cyan microcapsule contains a cyan dye chromogenic material as a primary component, a photo-curing resin, a photosensitizer, a photopolymerization initiator, etc. Likewise, the magenta microcapsule contains a magenta dye chromogenic material as a primary component, a photo-curing resin, a photosensitizer, a photopolymerization initiator, etc. The yellow microcapsule contains a yellow dye chromogenic material as a primary component, a photo-curing resin, a photosensitizer, a photopolymerization initiator, etc. An image receiving sheet 21 is provided separately from the recording sheet 19, on the surface of which a developer material is coated.

Above the exposure stand 18, a latent image forming device 22 is provided in which is included an exposure lamp 23, such as a fluorescent lamp, halogen lamp which emits white light. A trichtromatic resolution filter 24 is disposed to be movable in the direction perpendicular to the a light radiation path. The filter 24 is constituted with a red filter 24a transmitting only light of a particular wavelength (650 nm, in this embodiment) which photo-cures the cyan microcapsuels, two green filters 24b and 24c each transmitting only light of a particular wavelength (550 nm, in this embodiment) which photo-cures the magenta microcapsules, and a blue filter 24d transmitting only light of a particular wavelength (450 nm, in this embodiment) which photo-cures the yellow microcapsules.

The intermediary sheet 14 and the recording sheet 19 are moved together in the direction indicated by the arrow A in FIG. 1 at a predetermined speed in accordance with the movement of the exposure stand 18.

Figure 2:
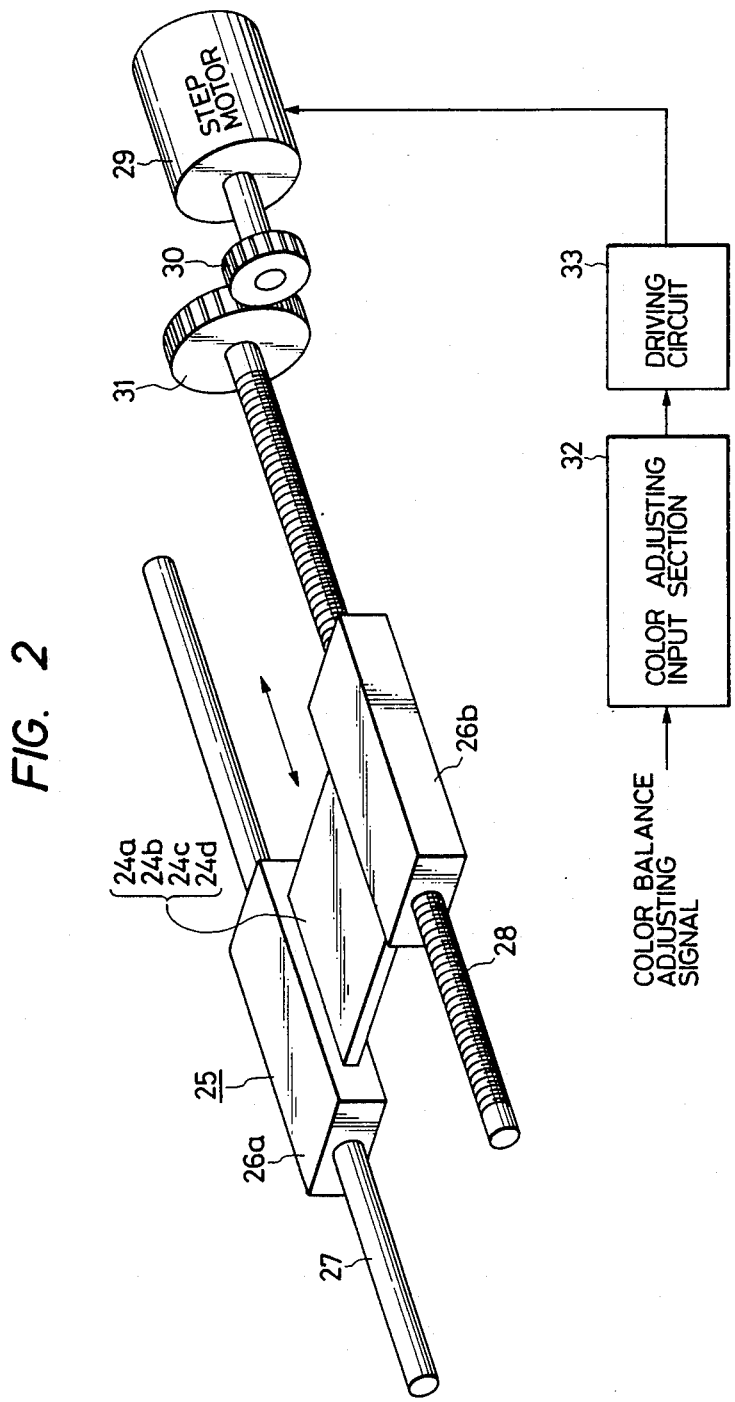
FIG. 2 is a partial perspective view showing a filter adjusting device.

As shown in FIG. 2, each of the filters 24a through 24d is provided with a position adjustment device 25 with which the filter is moved toward and away from the light radiation path. More specifically, the filter is bridged by a pair of supporting members 26a and 26b one of which 26a is slidably movable along a guide rod 27 and another of which 26b is threadingly movable on screw threads of a screw rod 28. In accordance with the rotations of a step motor 29, the screw rod 28 is rotated about its axis through two gears 30 and 31, thereby moving the filter in the axial direction of the screw rod 28. The rotation of the step motor 29 is controlled in response to a color balance adjusting signal which is inputted to a color adjusting input section 32 and applied to the step motor 29 through a driving circuit 33.

Referring back to FIG. 1, a pressure developing device 34 is disposed near the exposure stand 18. The photosensitive and pressure-sensitive recording sheet 19 which has been exposed through the intermediary sheet 14 by the exposure lamp 23 and the image receiving sheet 21 are passed through a nip between a pair of pressure rollers 35 for pressure development.

An operation of the recording apparatus thus arranged will next be described.

The lamp 5 is lit and the original 3 is scanned by the light radiated from the lamp 5. The light reflected on the original enters the CCD 9 through the reflection mirror 6, focusing lens 7 and filter 8. The CCD 9 reads the picture images of the original in the form of variations in light amplitude and converts a photo-signal to an electrical signal which is in turn fed through the amplifier 10 and the driver 11 to the impact head 12. In response to the electrical signal applied to the impact head 12, the latter performs impact color printing on the intermediary sheet 14 through the corresponding color ink ribbon 15.

The filter 8 is successively switched over in the order of the red filter 8a, the green filter 8b, and the blue filter 8i c, and the scanning light is radiated from the light source 5 each time the filter is switched to one from the other. In the state where the red filter 8a is disposed in the light path, a red-spectrum light contained in the reflected light passes through the red filter 8a and is read out by the CCD 9. The complementary color of red, i.e. blue, is not present in the output of the CCD 9. In response to the output from the CCD 9, a cyan-color image is printed on the intermediary sheet 14 in conformity with the portion where no red-spectrum light is sensed by the CCD 9. That is, the cyan-color image printed on the intermediary sheet 14 corresponds to the portion on the original where red-color component image exists. Next, when the red filter 8a is offset from the light path and the green filter 8b is disposed in the light path, a magenta-color image is printed on the intermediary sheet 14 in conformity with the portion where no green-color component is sensed by the CCD 9. Likewise, when the green filter 8b is offset from the light path and the blue filter 8c is disposed in the light path, a yellow-color image is printed on the intermediary sheet 14 in conformity with the portion where no blue-color component is sensed by the CCD 9. A red-color light shielding image corresponding to the red-color image on the original appears on the intermediary sheet 14 upon overlapping printing both the magenta-color and yellow-color images. Likewise, upon overlappingly printing both the cyan-color and magenta-color images, a blue-color light shielding image appears on the intermediary sheet 14, while upon overlappingly printing both the cyan-color and yellow-color images, a green-color light shielding image appears on the intermediary sheet 14. In this manner, a color light shielding image corresponding to the color image of the original is printed on the intermediary sheet 14. The red-color light shielding image formed on the intermediary sheet 14 does not allow the red-spectrum light to pass therethrough. Likewise, the green-color and blue-color light shielding images formed thereon do not allow the green-and blue-spectrum lights to pass therethrough.

The intermediary sheet 14 carrying the color picture image is overlaid the photosensitive and pressure-sensitive recording sheet 19 and the both sheets 14 and 19 are moved together in the direction indicated by the arrow A in accordance with the movement of the exposure stand 18. In the condition that the filters 24a through 24d are positioned as shown in FIGS. 1 and 3D by the actuations of the respective adjusting devices 25, the exposure lamp 23 is lit. The recording sheet 19 underlying the intermediary sheet 14 is exposed by the light passing through the filters 24a through 24d, thereby forming a latent image on the photosensitive and pressure-sensitive recording sheet 19.

More specifically, as shown in FIG. 3A, when the exposure is taking place in the condition that only the red filter 24a is disposed in the light path and the remaining filters 24a through 24d are retracted from the light path, the light radiated from the exposure lamp 23 is irradiated onto the photosensitive and pressure-sensitive recording sheet 19 through the portion where no filter is present to be thereby perform trichromatic exposure. In the portion where the red filter 24a is present, on the other hand, only the light of wavelength which photo-cures the cyan microcapsules passes through the red filter 24a and is irradiated onto the photosensitive and pressure-sensitive recording sheet 19 unless interrupted by the red-color light shielding image on the intermediary sheet 14. The cyan microcapsules on the recording sheet 19 are photo-cured and the magenta and yellow microcapsules remain unexposed for the most part. Thus, a red-tone color picture image is obtained.

As shown in FIG. 3B, when the exposure is taken place in the condition that both the green filter 24b and the blue filter 24d are disposed in the light path, the trichromatic exposure is taken place through the portion where no filters are present. In the portion where the green filter 24b is present, on the other hand, only the light of wavelength which photo-cures the magenta microcapsules is irradiated onto the photosensitive and pressure-sensitive recording sheet 19 unless interrupted by the green-color light shielding image on the intermediary sheet 14. The magenta microcapsules on the recording sheet 19 are photo-cured. Likewise, in the portion where the blue filter 24d is present, only the light of wavelength which photo-cures the yellow microcapsules is irradiated onto the photosensitive and pressure-sensitive recording sheet 19 unless interrupted by the blue-color light shielding image on the intermediary sheet 14, and the yellow microcapsules on the recording sheet 19 are photo-cured and the cyan microcapsules remain unexposed for the most part. As a result, a color picture image having a weak red tone is obtained in the state shown in FIG. 3B.

As shown in FIG. 3C, when the exposure is taken place in the condition where both the red filter 24a and the green filter 24b are overlapped in the left portion of the exposure region and both the green filter 24c and the blue 24c are overlapped in the right portion thereof, the trichromatic exposure is taken place in the central portion where no filters are present while in the portions where the filters are overlapped, the light from the exposure lamp 23 does not transmit through the filter portions and thus exposure is not taken place in these portions. Hence, by adjusting the area of the overlapped filter portions, the amount of light to be exposed can be varied.

By disposing the filters 24a through 24d in appropriate positions in the light path and providing the blue exposure region, trichromatic exposure region, red exposure region and unexposed region as shown in FIG. 3D, the exposure can be taken place to effect a desired color balancing.

Upon termination of the exposure as described above, the image receiving sheet 21 is brought to be in facial contact with the photosensitive and pressure-sensitive recording sheet 19. The recording sheet 19 and the image receiving sheet 21 are fed into the pressure developing device 34 where the microcapsules on the photosensitive and pressure-sensitive recording sheet 19 which have not photo-cured are ruptured and the picture image is developed on the image receiving sheet 21 in accordance with the reaction of the chromogenic material flown out from the microcapsules and the developer material coated on the surface of the image receiving sheet 21.

More specifically, in the portion where only the cyan microcapsules are photo-cured, the microcapsules of magenta and yellow are ruptured and red-color appears on the image receiving sheet 21 upon subtractive color mixture of magenta and yellow chromogenic materials. In the portion where only the magenta microcapsules are photo-cured, green-color appears thereon upon subtractive color mixture of cyan and yellow. Likewise, in the portion where only the yellow microcapsules are photo-cured, blue-color appears thereon upon substractive color mixture of cyan and magenta. In the case where the picture image on the original 3 is of blackcolor, a black-color picture image appears on the image receiving sheet 21 by substractive color mixture of cyan, magenta and yellow, since none of the red filter 8a nor the green filter 8b nor the blue filter 8c passes the light reflected on the original. The black-color on the original 3 can thus be reproduced on the image receiving sheet 21. When the white-color region of the original is scanned, no output is obtained from the CCD 9 whichever the red-filter, green-filter or the blue-filter may be set. Thus, no printing is performed and the intermediary sheet is remained transparent.

While the present invention has been described with reference to a specific embodiment, a variety of changes or modification may be made without departing from the scope and spirit of the invention. For example, the latent image forming device 22 may be modified so as to be movable at a predetermined speed while stationary maintaining the intermediary sheet 14 and the photosensitive and pressure-sensitive recording sheet 19. Further, a so-called self-contained type photosensitive and pressure-sensitive record sheet may be used instead of the transfer type photosensitive and pressure-sensitive recording sheet. The self-contained recording sheet is disclosed in U.S. Pat. No. 4,440,846, in which an encapsulated chromogenic material or dye precursor and a developer material are co-deposited on one surface of a single substrate as one layer or as two contiguous layers. Further, a color slide may be used in place of the intermediary sheet.

As described, according to the first embodiment of the invention, adjustment of the color balance can be carried out easily by selectively inserting the filters and adjusting the area of the filters to be disposed in the optical path.

Figure 4:
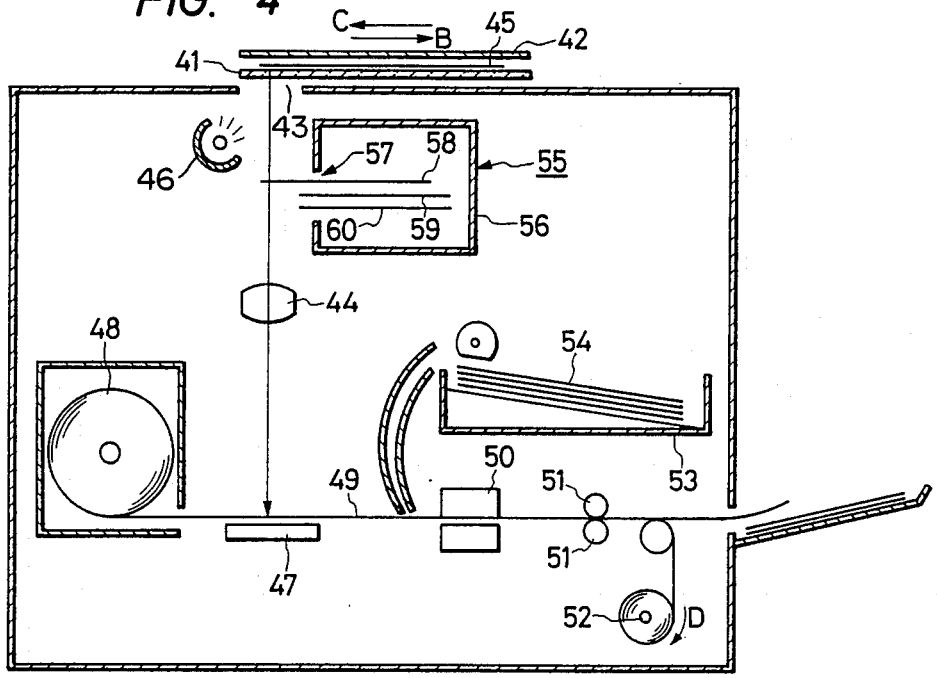
FIG. 4 is a cross-sectional side view showing a color picture image recording apparatus according to a second embodiment of the present invention.
Figure 5:
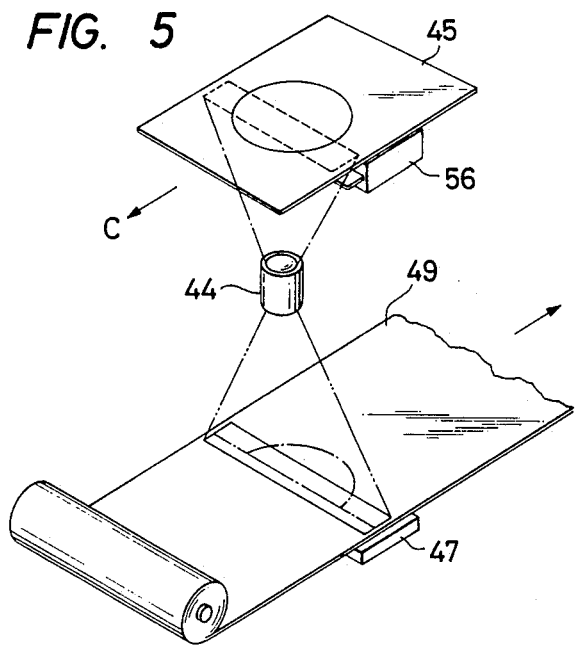
FIG. 5 is a perspective view showing an optical system employed in the apparatus according to the second embodiment of the invention.
Figure 6:
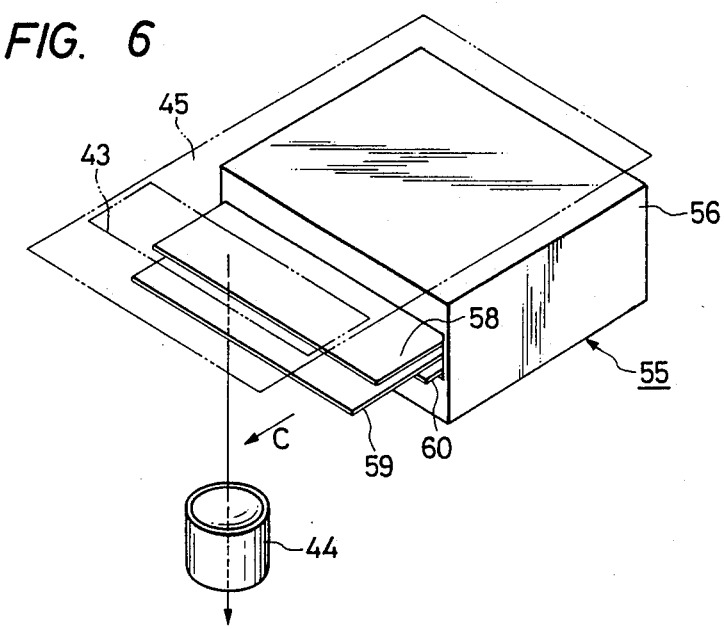
FIG. 6 is a perspective view shown an arrangement of a filter unit used in the second embodiment of the invention.

A second embodiment of the present invention will be described with reference to FIGS. 4 through 8. FIG. 4 is a cross-sectional side view showing the color picture image recording apparatus in which an original-support member 41 and a cover member 42 are provided in the upper portion of the apparatus similar to the apparatus shown in FIG. 1. The original-support member 41 is bi-directionally movable in the directions B and C in accordance with an output of a driver (not shown). A slit 43 is formed on the upper surface of the apparatus which slit longitudinally extends in the direction perpendicular to the moving direction of the original-support member 41. A light source 46 is provided in the left lower portion of the slit 43, which irradiates light onto an original placed on the original-support member 42 through the slit 43. A stationary exposure stand 47 is disposed in the position where the light reflected on the original 45 is focused after passing through a focusing lens 44. A photosensitive and pressure-sensitive recording sheet 49 wound around a supply roll 48 is taken out and placed on the exposure stand 47. After passing through a development unit 50 and a nip between a pair of control rollers 51, the recording sheet 49 is wound around a take-up roll 52. In the development unit 50, the latent image formed on the recording sheet 47 is developed and transferred onto an image receiving sheet 54 which is taken out from a sheet cassette 53. The take-up roll 52 is biased to be rotatable in the direction indicated by an arrow D and takes up the recording sheet 49 being fed out by the control rollers 51. The running speed of the recording sheet 49 depends on the rotational speed of the control rollers 21.

A filter unit 55 is disposed immediately below the upper surface of a housing of the apparatus, and yellow filter 58, magenta filter 59 and cyan filter 60 are contained in the filter unit 55. The respective filters are horizontally extendable from an opening 57 provided in the left side portion of a filter casing 56 in accordance with the actuation of its associated linear step motor 33 (see FIG. 8) provided in the interior of the filter casing 56.

Figure 7:
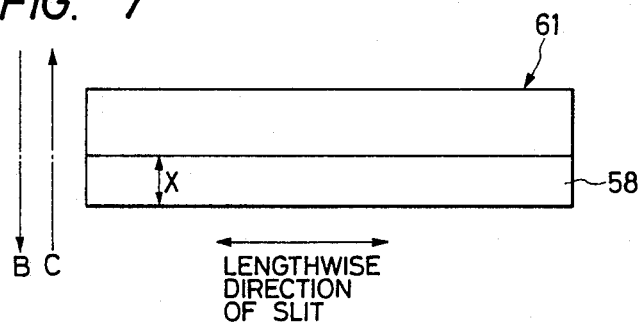
FIG. 7 is an explanatory diagram showing the operation of the filter.
Figure 8:
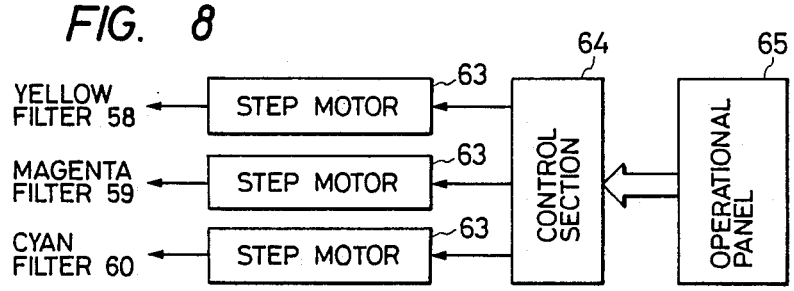
FIG. 8 is a block diagram of a filter unit controlling device.

Referring to FIG. 8, the linear step motors 63 are connected to a control section 64 containing therein a CPU (Central Processing Unit). The control section 64 supplies control signals to the step motors 63, and in response thereto displacements of movable portions of the step motors 63 are controlled. The control section 64 is connected to an operation panel 65 which serves as a machine interface between the operator and the control section 64. The position of each of the filters is moved through the operation of the operation panel 65. As shown in FIG. 7, each of the filters is inserted into the cross-sectional plane of the reflection light which focuses on the photosensitive and pressure-sensitive recording sheet 49. That is, the filter is partially positioned in a plane (of substantially the same configuration of the slit on the upper surface of the apparatus) perpendicular to the reflection light path. While FIG. 7 shows that the yellow filter 58 is being partially extending to the light path, the magenta filter 59 and the cyan filter 60 can similarly be extended thereto.

The operation of the second embodiment as constructed above will next be described.

The original 45 is placed upside down on the original-support member 41 and the cover member 42 is closed. The original-support member 41 is moved in the direction indicated by the arrow B in FIG. 4 so that the left end portion of the original 45 is in the right side of the slit 43. Then, the light source 46 is lit and the original-support member 41 is moved at a predetermined speed in the direction indicated by the arrow C. The control rollers 51 rotate in synchronization with the movement of the original-support member 43 to cause the photosensitive and pressure-recording sheeting 49 to be wound at a predetermined speed around the take-up roller 52. The peripheral speed of the control rollers 51 is determined by multiplying a magnification value of the image formed through the lens on the recording sheet 40 with respect to the image of the original by the moving speed of the original-support member 41. The photosensitive and pressure-sensitive recording sheet 49 passes the exposure stand 47 at a constant speed.

The light irradiated by the light source 46 is reflected on the original moving above the slit 43. The reflected light passes through the lens 44 and focused on the photosensitive and pressure-sensitive recording sheet 49. The moving speed of the original 45 is correlated with the moving speed of the recording sheet 49 as described above. A negative latent image is formed on the recording sheet 49 and is developed in the developing section 50. The resultant image is transferred onto the image receiving sheet 54.

The color correction method will next be described. In the case that the image formed on the image receiving sheet 54 is bluish compared with the color of the original image 45a, it is required that the blue-color component be eliminated to some extent. To this effect, the operation panel 65 is operated so that the yellow filter 57 is inserted into the optical path 51. When the original-support member 41 is moved at a speed of v and the yellow filter 58 positioned close to the slit 43 is inserted into the optical path for the amount of x, the photosensitive and pressure-sensitive recording sheet 49 is exposed by the reflection light having passed through the yellow filter 58 for a period of time x/v and thereafter exposed by the reflection light not having passed therethrough for a period of time (W-v)/v, in which W is the width of the slit 43 perpendicular to the moving direction of the original-support member 41. This means that the recording sheet 49 is exposed by both the red-color and green-color lights for the period of time W/v, and by the blue-color light for the period of time x/v. That is, the exposure by the blue-color light is suppressed, and as a result the intended color correction is accomplished. While description of has been made with respect to the color correction of blue, the color correction can be carried out as desired provided that the amount of insertion of one or more the filters is adjusted.

While the second embodiment of the invention has been specifically described, a variety of changes or modification can be made without departing the scope and spirit of the invention. For example, the filter may not necessarily be positioned close to the slit but be at an arbitrary position except between principle points of the lens. Furthermore, the slit 43 may not necessarily be provided, in which case the reflected light may be directed to the recording sheet 49 upon making the amount of irradiation uniform by means of reflector or the like.

As described, according to the second embodiment of the invention, the color correction can be easily carried out inexpensively.

What is claimed is:

1. A color image recording apparatus for recording an image of an original on a developer sheet with the use of a light-transmissive sheet and a photosensitive recording sheet, said apparatus comprising;
  image forming means for forming a light shielding image corresponding to said image of said original on said light-transmissive sheet, said light-transmissive sheet on which said light shielding image is formed being used as a mask member, said mask member being moved in a first direction;
  a lamp for emitting a white light;
  filter means disposed to receive said white light and selectively passing a light of a predetermined wavelength, a filtering characteristic of said filter means being variable;
  exposure means disposed downstream of said image forming means relative to the moving direction of said mask member for exposing said photosensitive recording sheet to said filtered light through said mask member to form a latent image corresponding to said light-shielding image on said photo-sensitive recording sheet, said photosensitive recording sheet carrying said latent image being moved in a second direction; and
  developing means disposed downstream of said exposure means relative to the moving direction of said photo-sensitive recording sheet for developing said latent image into a visible image on said developer sheet, said developer sheet being held in superposed relation with said photosensitive recording sheet, whereby a color tone of said visible image is adjustable by varying said filtering characteristic of said filter means.

2. The color image recording apparatus as claimed in claim 1, wherein said photosensitive recording sheet carries on its surface a first material and said developer sheet carries on its surface a second material, said first material comprising a photosensitive material and a chromogenic material of a color selected from the color comprising cyan, magenta and yellow, said second material comprising a developer material, said photo-sensitive material and said chromogenic material being encapsulated in a pressure rupturable microcapsule and a mechanical strength of said microcapsule varies when exposed to said light of said predetermined wavelength, said visible image being formed upon reaction of said chromogenic material with said developer material.

3. The color image recording apparatus as claimed in claim 1, further comprising an operational panel from which a color adjusting signal is outputted; a controller connected to said operational panel for supplying a driving signal in accordance with the color adjusting signal supplied from said operational panel; and a motor coupled to said controller and driven in response to the driving signal for moving said filter means, said filtering characteristics of said filter means being varied as said filter means is moved.

4. The color image recording apparatus as claimed in claim 1, wherein said filter means comprises a red filter for passing only a light of a wavelength which causes to vary the mechanical strength of a cyan-containing microcapsule, a blue filter for passing only a light of a wavelength which causes to vary the mechanical strength of a yellow-containing microcapsule, a green filter for passing only a light of a wavelength which causes to vary the mechanical strength of a magenta-containing microcapsule.

5. The color image recording apparatus as claimed in claim 4, further comprising means for adjusting a position of each of said red filter, said blue filter and said green filter.

6. The color image recording apparatus as claimed in claim 4, further comprising an operational panel from which a color adjusting signal is outputted; a controller connected to said operation panel for supplying a driving signal in accordance with the color adjusting signal supplied from said operational panel; and a first motor coupled to said controller and driven in response to the driving signal for moving said red filter; a second filter motor coupled to said controller and driven in response to the driving signal for moving said blue filter; and a third motor coupled to said controller and driven in response to the driving signal for moving said green filter, said filtering characteristics of said filter means being varied as said red, blue and green filters are selectively moved.

7. A color image recording apparatus for recording an image of an original on a developer sheet with the use of a photosensitive recording sheet, said apparatus comprising:
  a frame formed with a slit;
  an original support member for supporting said original thereon, said original support member being movably disposed on said frame to transverse said slit;
  conveying means for conveying said photosensitive recording sheet in a predetermined direction;
  a lamp for emitting white light toward said original through said slit, a light bearing said image of said original being reflected from said original;
  filter means for receiving said image bearing light and selectively passing a light of a predetermined wavelength, said filter means being movably disposed in a direction parallel to said predetermined direction in which said photo-sensitive recording sheet is conveyed, a filtering characteristic of said filter means being variable as said filter means is moved;
  exposure means for exposing said photosensitive recording sheet to said light of said predetermined wavelength to form a latent image corresponding to said image of said original on said photosensitive recording sheet; and
  developing means disposed downstream of said exposure means relative to said predetermined direction for developing said latent image into a visible image on said developer sheet while superposedly holding said developer sheet with said photosensitive recording sheet, whereby a color tone of said visible image is adjustable by varying said filtering characteristic of said filter means.

8. The color image recording apparatus as claimed in claim 7, wherein said slit extends in a direction substantially perpendicular to the moving direction of said original support member.

9. The color image recording apparatus as claimed in claim 7, wherein said photosensitive recording sheet carries on its surface a first material and said developer sheet carries on its surface a second material, said first material comprising a photosensitive material and a chromogenic material of a color selected from the colors comprising cyan, magenta and yellow, said second material comprising a developer material, said photosensitive material and said chromogenic material being encapsulated in a pressure rupturable microcapsule and a mechanical strength of said microcapsule varies when exposed to said light of said predetermined wavelength, said visible image being formed upon reaction of said chromogenic material with said developer material.

10. The color image recording apparatus as claimed in claim 9, wherein said filter means comprises a red filter for passing only a light of a wavelength which causes to vary the mechanical strength of a cyan-containing microcapsule, a blue filter for passing only a light of a wavelength which causes to vary the mechanical strength of a yellow-containing microcapsule, and a green filter for passing only a light of a wavelength which causes to vary the mechanical strength of a magenta-containing microcapsule.

11. The color image recording apparatus as claimed in claim 10, further comprising an operational panel from which a color adjusting signal is outputted; a controller connected to said operation panel for supplying a drive signal in accordance with the color adjusting signal supplied from said operational panel; and a motor coupled to said controller and driven in response to the driving signal for moving said filter means.

* * * * *